United States Patent
Rajczewski et al.

(10) Patent No.: US 9,638,734 B2
(45) Date of Patent: May 2, 2017

(54) ELECTRICAL CURRENT SYSTEM INCLUDING VOLTAGE DROP COMPONENT

(71) Applicant: Hamilton Sundstrand Corporation, Windsor Locks, CT (US)

(72) Inventors: John Rajczewski, Longmeadow, MA (US); David J. Manna, Middletown, CT (US)

(73) Assignee: HAMILTON SUNDSTRAND CORPORATION, Windsor Locks, CT (US)

(*) Notice: Subject to any disclaimer, the term of this patent is extended or adjusted under 35 U.S.C. 154(b) by 367 days.

(21) Appl. No.: 14/554,303

(22) Filed: Nov. 26, 2014

(65) Prior Publication Data

US 2016/0146875 A1 May 26, 2016

(51) Int. Cl.
| | | |
|---|---|---|
| *G01R 19/18* | (2006.01) | |
| *G01R 31/02* | (2006.01) | |
| *G01R 19/25* | (2006.01) | |
| *G01R 19/00* | (2006.01) | |
| G01R 31/34 | (2006.01) | |

(52) U.S. Cl.
CPC ....... *G01R 31/025* (2013.01); *G01R 19/0092* (2013.01); *G01R 19/2506* (2013.01); *G01R 31/026* (2013.01); *G01R 31/343* (2013.01)

(58) Field of Classification Search
CPC .......... G05B 11/12; G08C 15/04; H03C 1/62; H03D 1/24; H03M 3/41; H04N 21/42676; H04N 7/045; G01R 1/20; G01R 1/22; G01R 11/06; G01R 19/20; G01R 33/0283; G01R 15/20; G01R 21/08; G01R 33/075; G01R 15/185; G01R 19/03; G01R 19/18; G01R 19/22; G05G 2009/04755; G06G 7/162

See application file for complete search history.

(56) References Cited

U.S. PATENT DOCUMENTS

| | | | |
|---|---|---|---|
| 5,426,416 A | 6/1995 | Jefferies et al. | |
| 2003/0218495 A1 | 11/2003 | Edell et al. | |
| 2009/0206818 A1* | 8/2009 | Horan | H02M 5/257 323/311 |
| 2010/0085034 A1 | 4/2010 | Sakayori | |
| 2013/0049686 A1* | 2/2013 | Erhart | H02H 9/025 320/109 |

OTHER PUBLICATIONS

EP SR, Issued May 20, 2016, U310541EP.

* cited by examiner

*Primary Examiner* — Tung X Nguyen
(74) *Attorney, Agent, or Firm* — Cantor Colburn LLP

(57) ABSTRACT

An electronic open-circuit current measuring circuit is configured to measure a current delivered between a current source and a load during an open circuit condition. The electronic open-circuit current measuring circuit includes an electronic voltage drop component electrically connected between a first buffer output and an electrical voltage difference calculating circuit. The voltage drop component is configured to reduce a first voltage level of the first buffered output voltage below a second voltage level of the second buffered output voltage in response to an open circuit condition.

15 Claims, 4 Drawing Sheets

ELECTRICAL CURRENT SYSTEM INCLUDING VOLTAGE DROP COMPONENT

TECHNICAL FIELD

The present invention relates generally to electrical motor systems, and more particularly, to an open circuit current measuring circuit included in an electrical motor system.

BACKGROUND

Current sources may be implemented in various electrical systems such as, for example, electrical torque motor systems, to drive one or more mechanical systems. Sensing circuits may be used to determine an amount of current that is output from the current source. Conventional sensing circuits typically include a sensing element having a first terminal connect to a high voltage rail of the sensing circuit and a second terminal connected to the low voltage of the sensing circuit. The sensing element measures an electrical voltage generated thereacross in response to receiving the electrical current output from the current source. The measured electrical voltage is then output to an analog-to-digital (A/D) converter configured to calculate a voltage differential between the high voltage rail and the low voltage rail and determine the amount of current output from the current source.

One or more operational amplifiers (op-amps) are typically disposed upstream from the A/D converter to isolate and amplify the voltage differential. The op-amps are powered leveraging current provided by the same power source that powers the current source. When the current source experiences an open circuit, e.g., a disconnection between the current source and a load, the current source outputs a max voltage with no current.

It is common for the op-amps to include variations in performance tolerances such as, for example, maximum voltage swing and/or voltage offset. Consequently, a first op-amp connected to the high voltage rail may output a different voltage level than a second op-amp connected to the low-side rail, even though the op-amps are operating at maximum output. As a result there is a chance (e.g., 50% chance) that the high voltage rail op-amp outputs a higher voltage level than the output of the low voltage rail op-amp causing the voltage differential signal to be positive. This positive differential voltage is sent through an instrumentation amplifier and outputs a positive voltage which is read by the A D converter. The positive voltage A/D reading equates to a positive current measurement, even though there is no current being output from the current source due to the open circuit.

SUMMARY

According to a non-limiting embodiment, an electronic open-circuit current measuring circuit is configured to measure a current delivered between a current source and a load during an open circuit condition. The electronic open-circuit current measuring circuit includes a first electronic buffer operation amplifier and a second electronic buffer operation amplifier. The first electronic buffer operation amplifier receives a first input voltage and generates a first buffered output voltage. The second electronic buffer operation amplifier receives a second input voltage different from the first input voltage, and generates a second buffered output voltage different from the first buffered output voltage. An electronic voltage difference calculating circuit is in electrical communication with the first buffer operation amplifier and the second buffer operation. The voltage difference calculating circuit is configured to determine a voltage differential based on the first buffered output voltage and the second buffered output voltage. The electronic open-circuit current measuring circuit further includes an electronic voltage drop component electrically connected between the first buffer output and the electrical voltage difference calculating circuit. The voltage drop component is configured to reduce a first voltage level of the first buffered output voltage below a second voltage level of the second buffered output voltage in response to the open circuit condition.

According to another non-limiting embodiment, a method of measuring a current level delivered between a current source and a load during an open circuit condition comprises generating a first buffered output voltage based on a first input voltage, and generating a second buffered output voltage based on a second input voltage different from the first input voltage. The second buffeted output voltage is different from the first buffered output voltage. The method further includes determining a voltage differential based on the first buffered output voltage and the second buffered output voltage. The method further includes reducing a first voltage level of the first buffered output voltage below a second voltage level of the second buffered output voltage in response to the open circuit condition.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION OF THE INVENTION

At least one embodiment of the disclosure solves the inaccurate current measurements experienced by the conventional current source sensing circuit by designing a voltage drop component that forces the output of the high voltage op-amp into a low voltage state in response to an open circuit at the current source. In this manner, the A/D converter detects a negative voltage differential across the high voltage rail and low voltage rail during the open circuit condition. The A/D converter interprets the negative voltage differential as 0 volts. Accordingly, the 0 volt differential may be used to calculate that no current (i.e., 0 A) is output from the current source such that an open circuit in the system, e.g., a disconnection between the current source and a load is accurately measured.

Figure 1A:
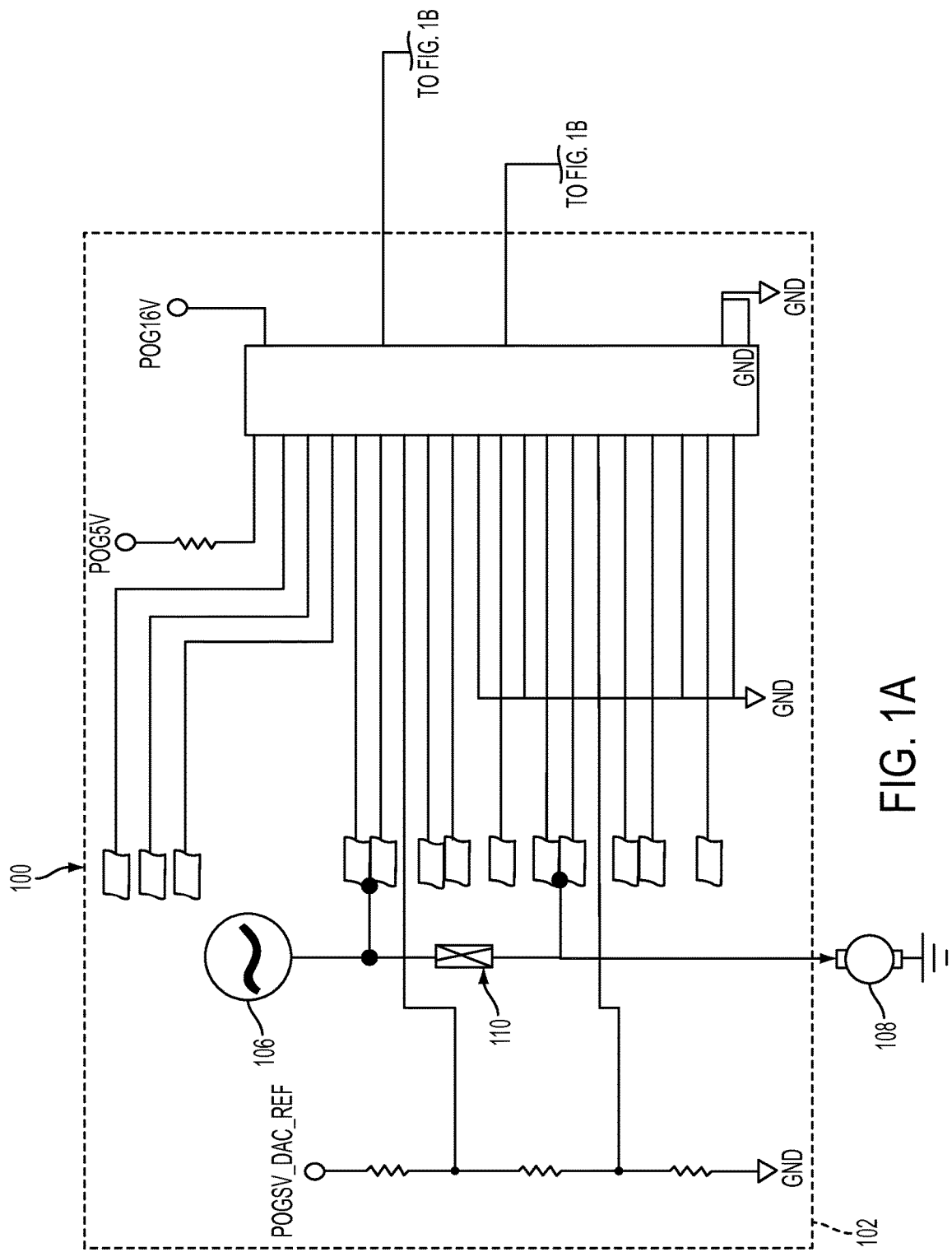
FIGS. 1A-1B illustrate an electrical schematic diagram of a torque motor current circuit according to a non-limiting embodiment of the invention.
Figure 1B:
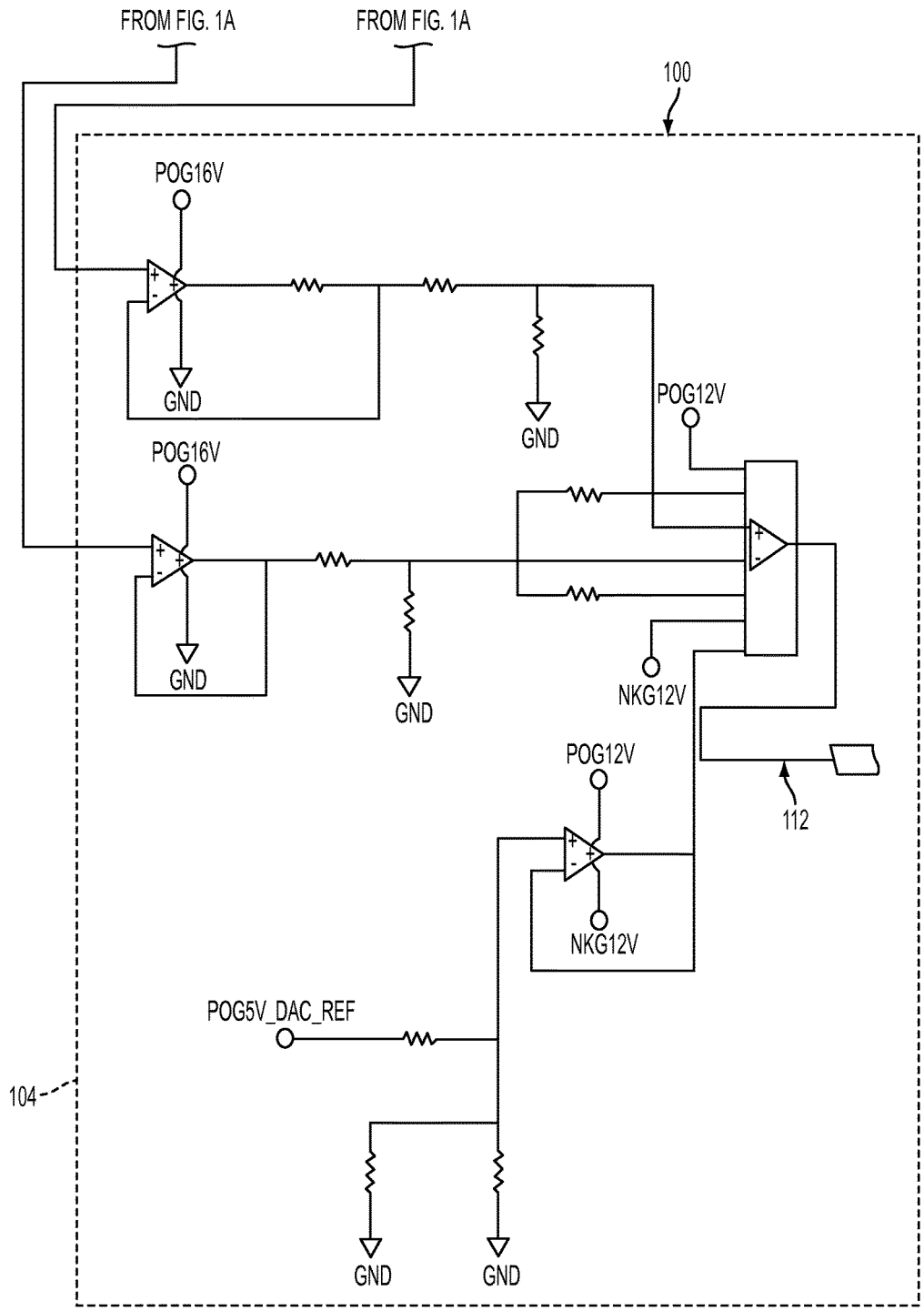

Turning now to FIGS. 1A-1B, an electrical torque motor current circuit 100 is illustrated according to a non-limiting embodiment. The electrical torque motor current circuit 100 includes an electronic current control sub-circuit 102 electrically connected to an electronic current measuring sub-circuit 104. The electronic multiplexer sub-circuit 102 switches the measured voltage across the current sensing element 110 into the current measuring sub-circuit 104. Current source 106 provides the current distributed through current sensing element 110 to electrical load 108. Current source 106 provides the current to 108 as well as other electrical loads. The electronic multiplexer sub-circuit 102 includes a current sensing element 110 that measures a first voltage value existing on a first input, e.g., a hi-side input, and a second voltage value existing on a second input, e.g., a lo-side input. The current sensing element 110 has a low resistance of approximately 10 ohms, for example, which does not adversely affect current flow delivered to the load 108.

The current measuring sub-circuit 104 receives both the hi-side voltage measurement signal and the lo-side measurement signal, and determines a voltage differential between the high-side and lo-side voltage measurements. A voltage differential signal 112 is output from the current measuring sub-circuit 104, and is delivered to an A/D converter (not shown in FIG. 1). The voltage differential signal 112 is a mathematical function of the current through electrical load 108. Software implements this mathematical function to calculate this current. In this manner, the voltage differential signal 112 generated by the current measuring sub-circuit 104 may be used to detect the current through electrical load 108 during normal operation as well as during open circuit conditions existing in the electrical torque motor current circuit 100 as discussed in greater detail below.

Figure 2:
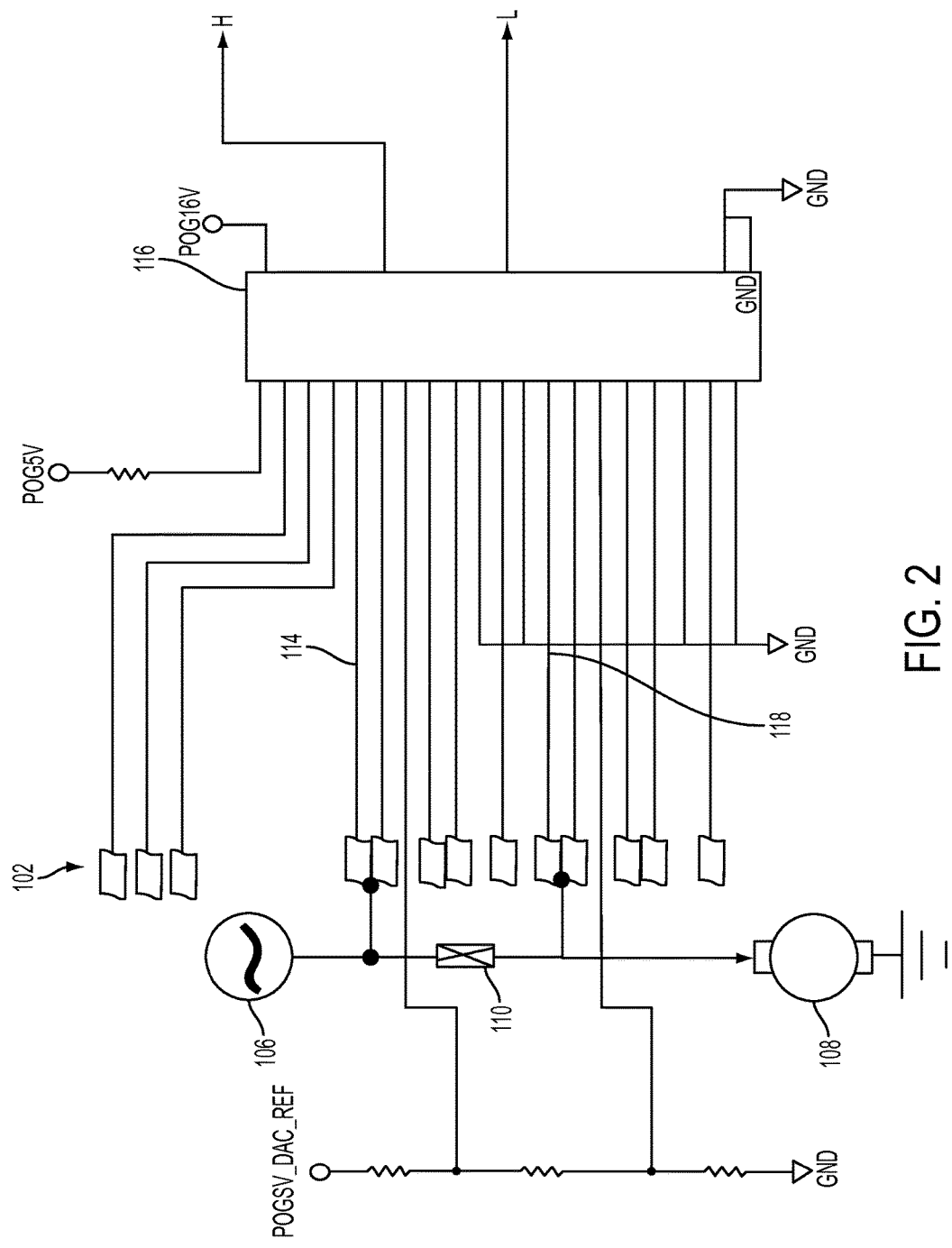
FIG. 2 is an electrical schematic diagram of an electronic current control sub-circuit included in the torque motor current circuit according to a non-limiting embodiment.

Turning to FIG. 2, the electronic multiplexer sub-circuit 102 is described in greater detail. For instance, the current sensing element 110 is shown having a first terminal connected to a first voltage input, e.g., a high voltage input 114 of a multiplexer 116 and a second terminal connected to a second voltage input, e.g., a low voltage input 118, of the multiplexer 116. The input of the load 108 is connected to the second terminal of the current sensing element 110. According to an embodiment, the current sensing element 110 is a resistor having a low resistance of approximately 10 ohms, for example, which does not adversely affect current flow delivered to the load. The multiplexer 116 outputs a first measured voltage signal (H) indicating a measured voltage existing at the high voltage input 114 and a second measured voltage (L) signal indicating a measured voltage existing at the low voltage input 118.

Figure 3:
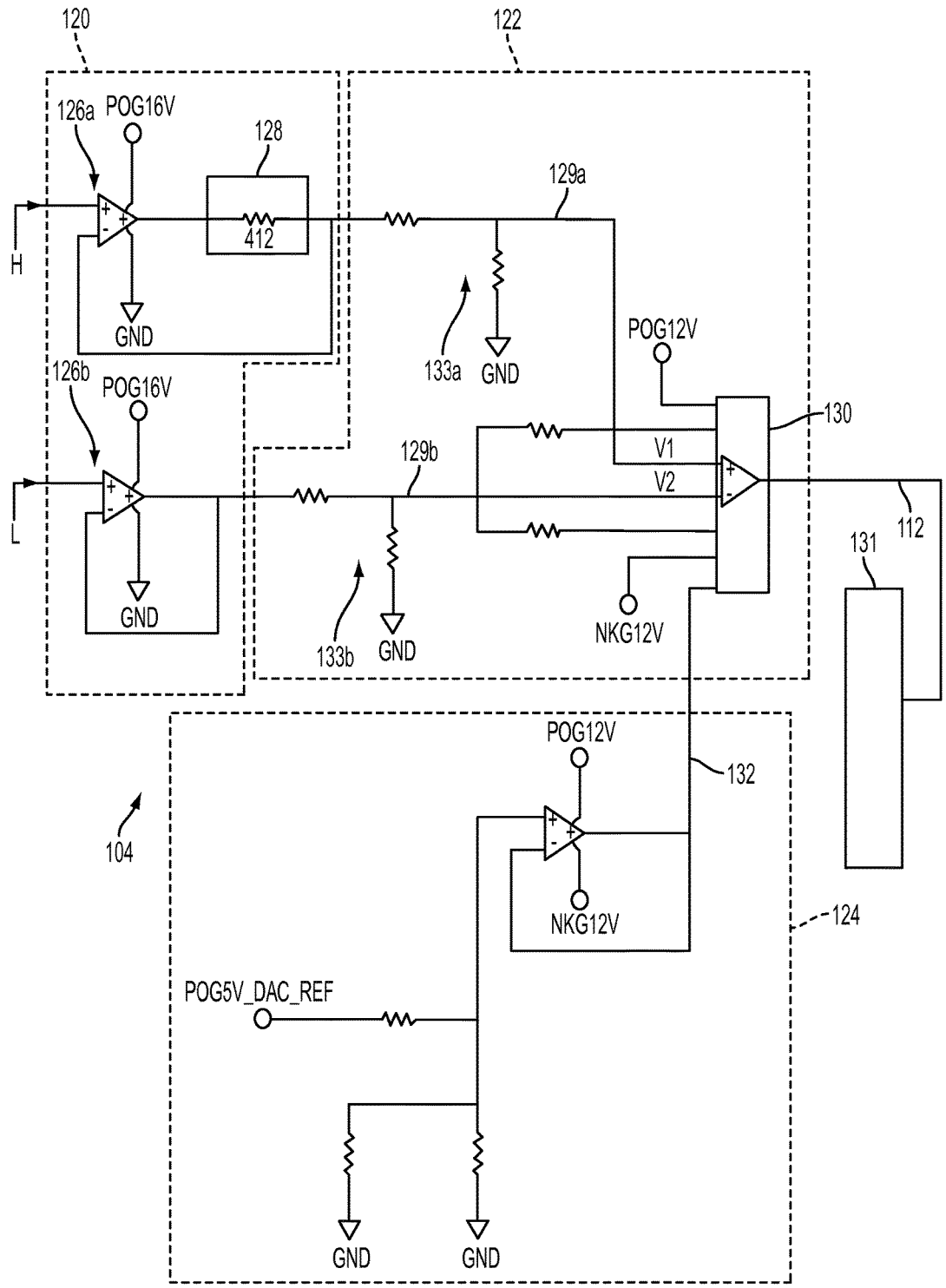
FIG. 3 is an electrical schematic diagram of an open circuit current measuring sub-circuit included in the torque motor current circuit according to a non-limiting embodiment.

Turning to FIG. 3, the electronic current measuring sub-circuit 104 is described in greater detail. The electronic current measuring sub-circuit 104 is electrically connected to the electronic multiplexer sub-circuit 102 to receive the first measured voltage signal (H) and the second measured voltage signal (L). Various individual electrical circuits form the electronic current measuring sub-circuit 104. According to a non-limiting embodiment, the electronic current measuring sub-circuit 104 includes a voltage buffer circuit 120, a voltage difference calculating circuit 122, and an offset circuit 124.

The voltage buffer circuit 120 includes a first buffer op-amp 126a that outputs a buffered high-side voltage based on the first measured voltage signal (H), and a second buffer op-amp 126b that outputs a buffered low-side voltage based on the second measured voltage signal (L). The voltage buffer circuit 120 further includes a voltage drop component 128 having a first terminal connected to the output of the first buffer op-amp 126a and a second terminal connected to the voltage difference calculating circuit 122. According to an embodiment, the voltage drop component 128 is a resistor having a resistance ranging from approximately 200 ohms, to approximately 1000 ohms, depending on the desired voltage drop during an open circuit condition. This resistance value is a function of the desired voltage drop, and the current through 128.

The electronic current measuring sub-circuit 104 further includes an instrumentation amplifier 130. According to an embodiment, the instrumentation amplifier 130 includes voltage dividers 133a-133b connected to first and second inputs 129a-129b. The current flowing through voltage drop component 128 is defined by a first voltage divider 133a (e.g., the 4.99 K and 10 K resistors) that is interposed between the output of the voltage drop component 128 and the first input 129a of the instrumentation amplifier 130. In this manner, the first voltage divider 133a generates a first voltage (V1) at input 129a. According to an embodiment, a resistance of the voltage divider 133a, for example, is chosen based on the defined current such that a large enough voltage drop is generated to ensure 0 volts on 112 during an open circuit condition, but not so much that it could affect the current measurement during normal non-open circuit conditions. The operation of the voltage drop component 128 is discussed in greater detail below. The voltage feedback path of the first buffer op-amp 126a is disposed downstream from the output of the voltage drop component 128. In this manner, the voltage drop component 128 does not affect the system during normal operation, i.e., when an open circuit condition does not exist between the electronic current control sub-circuit 102 and the load 108, since the first buffer op-amp 126a automatically compensates for the voltage drop across the voltage drop component 128 when not operating at the maximum driving rail voltage.

The voltage difference calculating circuit 122 receives the output from voltage drop component 128, and the output from the second buffer op-amp 126b, and determines a difference between a first voltage signal 129a and a second voltage signal 129b via the instrumentation amplifier 130 as understood by one of ordinary skill in the art. The voltage difference calculating circuit 122 generates the voltage differential signal 112, which is delivered to an A/D converter 131 configured to convert the voltage differential into a current value through electrical load 108.

The offset circuit 124 is in electrical connection with the difference calculating circuit 122 and is configured to generate a voltage offset signal 132, which is input to the instrumentation amplifier 130 to compensate for various tolerances, swings and/or resistances created by one or more electrical components of the torque motor current circuit. The instrumentation amplifier 130 adds the offset voltage indicated by the voltage offset signal 132 to the gain of the instrumentation amplifier 130 multiplied by the differential voltage to generate the final voltage differential signal 112.

When operating in normal condition, e.g., when no open circuit exists between the load 108 and the electronic multiplexer sub-circuit 102, the difference calculating circuit 122 determines a positive voltage differential and outputs the final voltage differential signal 112 to an A/D converter 131. The A/D converter 131 converts the final voltage differential value into a corresponding current value to determine the current value delivered to the load 108. When, however, operating during a fault condition, e.g., when an open circuit does exist between the load 108 and the electronic current control sub-circuit 102, the output of both the first buffer op-amp 126a and the second buffer op-amp 126b are equivalent to the maximum input rail supply voltage 106 as understood by one of ordinary skill in the art. The voltage drop component 128, however, forces a voltage drop thereacross. In other words, the voltage drop component 128 forces the voltage level (V)1 at the first amplifier input 129a below the voltage level voltage (V2) at the second amplifier input 129b. As a result, the instrumentation amplifier 130 calculates a negative voltage differential (V1−V2=−ΔV), and outputs a final voltage differential signal 112 indicating the negative voltage differential. The A/D converter 131 receives the final voltage differential signal 112 and automatically converts negative voltage values into a 0 ampere (A) current reading. In this manner, a current level of 0 A is always determined during an open circuit condition, e.g., when an open circuit does exist between the load 108 and the electronic current control sub-circuit 102. Accordingly, at least one embodiment of the invention provides an electronic torque motor current circuit 100 including an electronic current measuring sub-circuit 104 that outputs more accurate open circuit measurements when compared to conventional open circuit current measuring circuits.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. An electronic open-circuit current measuring circuit configured to measure a current delivered between a current source and a load during an open circuit condition, the electronic open-circuit current measuring circuit comprising:
a first electronic buffer operation amplifier that receives a first input voltage and generates a first buffered output voltage;
a second electronic buffer operation amplifier that receives a second input voltage different from the first input voltage, and generates a second buffered output voltage different from the first buffered output voltage;
an electrical voltage difference calculating circuit in electrical communication with the first buffer operation amplifier and the second buffer operation, the voltage difference calculating circuit configured to determine a voltage differential based on the first buffered output voltage and the second buffered output voltage; and
an electronic voltage drop component electrically connected between the first buffer output and the electrical voltage difference calculating circuit, the voltage drop component configured to reduce a first voltage level of the first buffered output voltage below a second voltage level of the second buffered output voltage in response to the open circuit condition.

2. The electronic open-circuit current measuring circuit of claim 1, wherein the electronic voltage drop component allows the first voltage level of the first buffered output voltage to exceed the second voltage level when no open circuit condition exists.

3. The electronic open-circuit current measuring circuit of claim 2, wherein the electrical voltage difference calculating circuit includes an instrumentation amplifier including a first voltage input electrically connected to the electronic voltage drop component and a second voltage input electrically connected to the second buffer operational amplifier.

4. The electronic open-circuit current measuring circuit of claim 3, wherein the instrumentation amplifier generates the voltage differential in response to subtracting the reduced first voltage level output provided by the electronic voltage drop component from the second voltage level of the second buffered output voltage.

5. The electronic open-circuit current measuring circuit of claim 4, wherein the electronic voltage drop component is a resistor having a first terminal electrically connected to an output of the first electronic buffer operation amplifier, and a second terminal electrically connected to the first voltage input of the instrumentation amplifier.

6. The electronic open-circuit current measuring circuit of claim 4, further comprising an electronic offset circuit configured to output a voltage offset signal indicative of an offset voltage to the electrical voltage difference calculating circuit.

7. The electronic open-circuit current measuring circuit of claim 6, wherein a first voltage divider is interposed between an output of the electronic voltage drop component and the first voltage input of the instrumentation amplifier, and wherein the electrical voltage difference calculating circuit outputs a voltage differential signal in response to adding the offset voltage to the voltage differential.

8. The electronic open-circuit current measuring circuit of claim 7, further comprising an analog-to-digital (A/D) converter configured to determine a current level output by the current source based on the voltage differential signal.

9. The electronic open-circuit current measuring circuit of claim 8, wherein the A/D converter determines the current level output is 0 Amps (A) in response to determining the voltage differential signal indicates a negative voltage differential.

10. A method of measuring a current level delivered between a current source and a load during an open circuit condition, the method comprising:
generating a first buffered output voltage based on a first input voltage;
generating a second buffered output voltage based on a second input voltage different from the first input voltage, the second buffeted output voltage being different from the first buffered output voltage;
determining a voltage differential based on the first buffered output voltage and the second buffered output voltage; and
reducing a first voltage level of the first buffered output voltage below a second voltage level of the second buffered output voltage in response to the open circuit condition.

11. The method of claim 10, further comprising allowing the first voltage level of the first buffered output voltage to exceed the second voltage level when no open circuit condition exists.

12. The method of claim 11, further comprising generating the voltage differential in response to subtracting the reduced first voltage level output from the second voltage level of the second buffered output voltage.

13. The method of claim 12, further comprising outputting a voltage offset signal indicative of an offset voltage.

14. The method of claim 13, further comprising outputting a voltage differential signal in response to adding the offset voltage to the voltage differential.

15. The method of claim 14, further comprising determining a current level output by the current source is 0 Amps (A) in response to determining the voltage differential signal indicates a negative voltage differential.

\* \* \* \* \*